United States Patent [19]
Sugiyama et al.

[11] Patent Number: 6,118,290
[45] Date of Patent: Sep. 12, 2000

[54] PROBER AND METHOD FOR CLEANING PROBES PROVIDED THEREIN

[75] Inventors: Masahiko Sugiyama, Nirasaki; Yoshihiko Nakamura; Kazumi Yamagata, both of Yamanashi-ken, all of Japan

[73] Assignee: Tokyo Electron Limited, Tokyo, Japan

[21] Appl. No.: 09/066,937

[22] Filed: Apr. 28, 1998

[30] Foreign Application Priority Data

Jun. 7, 1997 [JP] Japan ..................................... 9-165141

[51] Int. Cl.$^7$ ...................................................... G01R 31/02
[52] U.S. Cl. ........................ 324/754; 324/765; 324/158.1
[58] Field of Search ............................. 324/158.1, 73.1, 324/754, 765; 15/301; 451/28, 67; 134/32

[56] References Cited

U.S. PATENT DOCUMENTS

| | | | |
|---|---|---|---|
| 4,590,422 | 5/1986 | Milligan | 324/754 |
| 5,728,229 | 3/1998 | Despres | 134/32 |
| 5,778,485 | 7/1998 | Sano et al. | 15/301 |

*Primary Examiner*—Vinh P. Nguyen
*Attorney, Agent, or Firm*—Oblon, Spivak, McClelland, Maier & Neustadt, P.C.

[57] ABSTRACT

A prober including a probe card, a main chuck, a spacer, a conveying mechanism, and a supporting portion. The probe card is provided on an upper surface of a main body of the prober. The main chuck is provided in the main body of the prober, underneath the probe card, to be movable in X, Y, Z and θ directions. The spacer has an upper portion on which a cleaner tool for the probe card is held. The conveying mechanism for conveying the spacer between outside of the main body of the prober and a position on the main chuck. The supporting portion is provided on an outer side surface of the main chuck, for supporting the spacer. The main chuck is moved up and down directly underneath the probe card such that probes of the probe card is cleaned with the cleaner tool on the spacer held on the main chuck.

1 Claim, 5 Drawing Sheets

PROBER AND METHOD FOR CLEANING PROBES PROVIDED THEREIN

BACKGROUND OF THE INVENTION

The present invention relates to a method of cleaning probes, a probing method and a prober, and more specifically, to a method of capable of cleaning probes while an object to be examined, such as a semiconductor wafer (to be abbreviated as "wafer" hereinafter) is placed on a main chuck, a probing method of the same type, and a prober.

As a typical example of a conventional prober, a prober for electrically examining semiconductor integrated circuits (to be called "IC chips" hereinafter) formed on a wafer, will now be described.

As can be seen in FIG. 6, for example, a conventional prober 10 includes a cassette C for storing wafers W, a loader unit 11 for conveying wafers W from the cassette C, a prober unit 12 for examining wafers W conveyed by a conveying mechanism (not shown) provided in the loader 11, a controller for controlling the prober unit 12 and the loader unit 11, and a display device 14 which also serves as an operation panel for operating the controller 13.

A sub-chuck (not shown) is provided for the loader unit 11. The wafers W are pre-aligned by the sub-chuck with reference to the orientation flat, and the pre-aligned wafers W are conveyed to the prober unit 12 by the conveying mechanism.

In the prober unit 12, a main chuck 15 movable in X, Y, Z and θ directions, on which a wafer W is placed, an alignment mechanism 16 having an alignment bridge 16A or the like, for aligning a wafer W placed on the main chuck 15 accurately at a test position, probes (e.g. probe needle) 17A for performing an electrical test on a semiconductor integrated circuit (IC chip) formed on a wafer W aligned by the alignment mechanism 16, and a probe card 17 having the probe 17A, are arranged.

A head plate 18 is made to be openable in the upper surface of the prober unit 12. The probe card 17 is fixed via an insert ring 18A to an opening made at the center of the head plate 18. On the prober unit 12, a test head 19 is placed to be revolvable. The probe 17A is electrically connected to a tester (not shown) via the test head 19 revolving on the prober unit 12. A predetermined electrical signal outputted from the tester is transmitted via the probe 17A to an IC chip formed on the wafer W placed on the main chuck 15, and via a reverse route, a signal containing the result of the measurement of the electrical properties of the IC chip is transmitted to the tester. The tester thus carries out an electronic test on each of the IC chips on the basis of such a signal.

In order to test a wafer W, the main chuck 15 is moved in the X, Y and θ directions by the driving mechanism, and thus the wafer W on the main chuck 15 is aligned with the probe 17A. Then, the main chuck 15 is driven upwards (in the Z direction) such that an electrode pad (made of, for example, aluminum) of the IC chip formed on the wafer W is brought into contact with the probe 17A. In this operation, if a natural oxide film (made of aluminum oxide) or the like is formed on the surface of the electrode, the electrical connection between the probe 17A and the electrode pad fails. When this happens, the probe 17A scrapes off the natural oxide film or the like formed on the electrode pad 17A, and then they are brought into contact with each other, thus assuring the electrical connection between them. After a great number of tests, a residue O of aluminum oxide scraped off from electrode pads is stuck on the probe 17A as shown in FIG. 7, and as a result, the tests thereafter cannot be performed accurately.

In order to avoid this, conventionally, the terminal of the probe 17A is cleaned. In the example shown in FIG. 8, the terminal of the probe 17A is cleaned by a grinding plate 20. The grinding plate 20 is attached on an attachment plate 15A extending from the lateral surface of the main chuck 15. The terminal of the probe 17A is brought into contact with the grinding plate 20 and as the main chuck 15 is moved up and down, the terminal of the probe 17 is ground, thus eliminating the residue O.

As another example, a device having a grinding file placed at the central portion of the main chuck, has been developed (see Japanese Utility Model KOKAI Publication No. SHOWA 59-148251).

In the case of the conventional device in which the grinding plate for grinding the probes 17A is attached onto the attachment plate 15A provided on the lateral surface of the main chuck, the probes 17A is pressed by the grinding plate, and therefore a large bending moment is applied on the main chuck 15 via the attachment table 15A. In order to withstand the bending moment, the main chuck 15 is required to have a high mechanical strength. In particular, when the size of wafer is enlarged in diameter (for example, 12 inch diameter), the size of the main chuck 15 is increased accordingly, thus further increasing the bending moment. In order to deal with such an increased bending moment, it is required not only simply enlarging the main chuck 15, but also to reinforce the mechanical strength of the main chuck 15. Thus, the weight of the main chuck 15 is further increased, which is not desirable.

The above-described conventional device, and another type of the conventional device, in which the grinding file is placed on the central portion of the main chuck entail a problem that the wafer must be unloaded from the main chuck each time the probes are subjected to cleaning.

As the size of wafers W is enlarged in diameter, the number of IC chips formed on one wafer W is remarkably increased, and therefore the number of probing carried out for one wafer W is accordingly increased. As a result, a great amount of residue 0 is stuck to the probes 17A, and therefore there is an increased necessity of cleaning the probes 17A during the series of tests. In the case of the conventional cleaning device, the following operation is necessary. That is, the testing is paused, and the wafer W is once unloaded from the main chuck to the loader chamber. Subsequently, the probes 17A are ground, and after that, the wafer is loaded back onto the main chuck. Then, the wafer W is aligned and the test is continued once again. Thus, it requires a great amount of time to test one wafer W.

BRIEF SUMMARY OF THE INVENTION

An object of the present invention is to provide a method of cleaning the probes, a method of carrying out the probing at high efficiency, and a device for practicing such methods.

Another object of the invention is to carry out a method of cleaning the probes, and a method of carrying out the probing, with a device having a remodeled structure.

According to the present invention, at least one of the above objects will be achieved.

With the present invention, there are provided a method of cleaning the probes, which does not require to unload the wafer from the main chuck during testing, without applying a bending moment to the main chuck even if the diameter of an object to be tested, such as wafer, is enlarged.

According to the first aspect of the present invention, there is provided a method of cleaning probes of a probe card by using a cleaner tool provided for a main chuck for an object to be tested within a main body of a prober, the method comprising the steps of: detachably mounting a spacer on which the cleaner tool is held, onto the main chuck while the object to be tested is placed on the main chuck; and cleaning the probes with the cleaner tool by moving the main chuck.

According to another aspect of the present invention, there is provided a probing method for testing electrical properties of semiconductor integrated circuits formed on a semiconductor wafer, comprising:

the contacting step of moving a main chuck on which the semiconductor wafer is placed, towards a contactor having probes to be in contact with electrodes of at least one of semiconductor integrated circuits each having electrodes, so as to bring the probes in contact with the electrodes; and the testing step for testing the electrical properties of the semiconductor integrated circuits on a basis of test signals outputted from the probes;

wherein the probing method further comprises the cleaning step of cleaning the probes, and the cleaning step further comprises the steps of:

detachably mounting a holding tool on which the cleaner tool is held, onto the main chuck while the object to be tested is placed on the main chuck;

cleaning the probes with the cleaner tool by moving the main chuck; and removing the holding tool on which the cleaner tool is held, from the main chuck.

According to still another aspect of the present invention, there is provided a probing method including the testing step for testing the electric properties of the semiconductor integrated circuits formed on the semiconductor wafer, according to the above, wherein the cleaning step of cleaning the probes with the cleaner tool, further comprises the steps of:

grinding the probes; and polishing the probes.

According to still another aspect of the present invention, there is provided a prober comprising:

a probe card provided on an upper surface of a main body of the prober;

a main chuck provided in the main body of the prober, underneath the probe card, to be movable in X, Y, Z and θ directions;

a spacer having an upper portion on which a cleaner tool for the probe card is held;

a conveying mechanism for conveying the spacer between outside of the main body of the prober and a position on the main chuck; and a supporting portion, provided on an outer side surface of the main chuck, for supporting the spacer;

wherein the main chuck is moved up and down directly under neath the probe card such that probes of the probe card is cleaned with the cleaner on the spacer held on the main chuck.

According to still another aspect of the present invention, there is provided a prober comprising:

a probe card provided on an upper surface of a main body of the prober;

a main chuck provided in the main body of the prober, underneath the probe card, to be movable in X, Y, Z and θ directions;

a spacer on which the probe card is held;

a conveying mechanism for conveying the spacer between outside of the main body of the prober and a position on the main chuck; and a supporting portion, provided on an outer side surface of the main chuck, for supporting the spacer;

wherein the spacer, the conveying mechanism and the main chuck are used as a mechanism for replacing the probe card.

According to still another aspect of the present invention, there is provided a prober according to the above, wherein the conveying mechanism is mounted on the side surface of the main body of the apparatus, to be movable in forward and backward, and has a pair of left and right arms supporting the spacer movably between the outside of the main body of the probe apparatus and the main chuck.

According to still another aspect of the present invention, there is provided a prober according to the above, wherein the spacer has projections for alignment on its lower surface, and the supporting portion has recess portions to which the projections for alignment are fit.

According to still another aspect of the present invention, there is provided a prober comprising:

a main body of the prober;

a probe card having probes and being attachable to an upper portion of the main body;

a main chuck, provided underneath the probe card and being movable in x, y, z and θ directions, for a semiconductor wafer on which integrated circuits each having electrodes;

an alignment mechanism for aligning the electrodes of the integrated circuits with the probes of the probe card by moving the main chuck;

a holding tool for holding a part material loaded onto the main chuck and unloaded from the main chuck; and a conveying mechanism for conveying the holding tool between a place where the loading of the holding tool is started, and a place on the main chuck.

According to still another aspect of the present invention, there is provided a prober according to the above, wherein the part material loaded onto the main chuck and unloaded from the main chuck is the probe card, and the holding tool, the conveying mechanism and the main chuck constitute a mechanism for replacing the probe card.

According to still another aspect of the present invention, there is provided a prober according to the above, wherein the part material loaded onto the main chuck and unloaded from the main chuck is the cleaner tool for the probes of the probe card, and the holding tool having, at its upper section, a holding section for the cleaner tool, and a mount portion, at its lower section, to be mounted to the main chuck without having the holding tool contact to the semiconductor wafer on the main chuck.

According to still another aspect of the present invention, there is provided a prober according to the above, wherein the part material loaded onto the main chuck and unloaded from the main chuck is the cleaner tool for the probe card and the probes of the probe card, and the holding tool having, at its upper section, a holding section for the probe card and another holding section for the cleaner tool, and the holding tool having a mount portion, at its lower section, to be mounted to the main chuck without having the holding tool contact to the semiconductor wafer on the main chuck.

According to still another aspect of the present invention, there is provided a prober comprising:

a main body of the prober;

a probe card having probes and being detachable to an upper portion of the main body;

a main chuck, provided underneath the probe card and being movable in x, y, z and θ directions, for a semiconductor wafer on which integrated circuits each having electrodes;

an alignment mechanism for aligning the electrodes of the integrated circuits with the probes of the probe card by moving the main chuck;

a cleaner tool for cleaning the probes, the cleaner tool having a cleaning surface on its upper surface, and a grinding cleaner at least in a peripheral portion of the cleaning surface; and a conveying mechanism for conveying the holding tool between a place where the loading of the holding tool is started, and a place on the main chuck.

According to still another aspect of the present invention, there is provided a prober according to the above, wherein the cleaner tool having a polish cleaner at a central portion of its cleaning surface, and a grinding cleaner in a peripheral portion of the cleaning surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
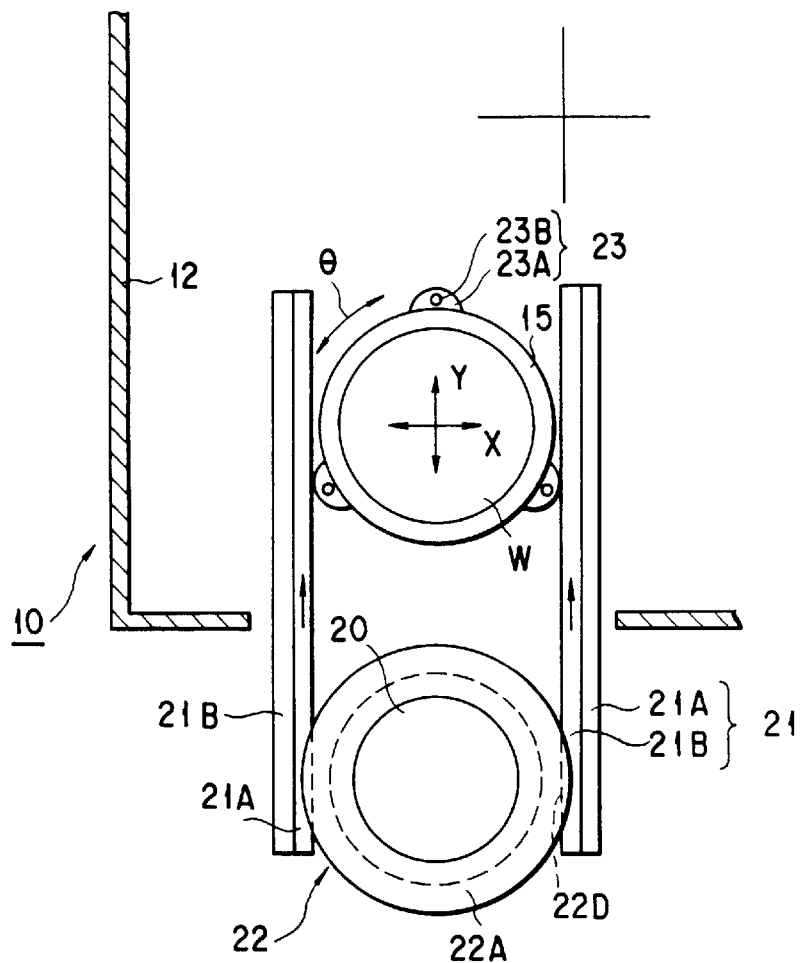
FIG. 1 is a diagram showing an embodiment of the prober according to the present invention.

The present invention relates to a method of cleaning the terminal of a probe, a probing method and a prober; however in order to make the explanation concise and clear, embodiments of the present invention will be described in detail in connection with the probing method and prober used in the test for semiconductor integrated circuits.

Embodiments of the prober according to the present invention will now be described with reference to FIGS. 1 to 5. In these figures, the same structural elements or corresponding ones as or to those of the conventional technique are designated by the same reference numerals.

Figure 2:
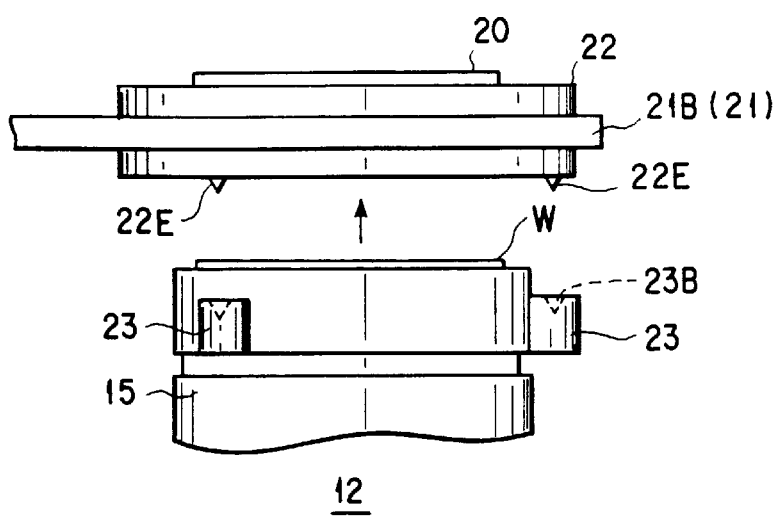
FIG. 2 is a diagram showing a lateral surface of the embodiment in the state where the spacer on which a grinding plate is placed is conveyed to a position directly above the main chuck.

As can be seen in FIGS. 1 and 2, the prober for semiconductor integrated circuits, according to an embodiment of the present invention, has a conveying mechanism 21 provided just in front of a prober chamber 12 including a main chuck 15. A clearing tool 20 is conveyed onto the main chuck 15 by the conveying mechanism 21. The following are detailed descriptions of the relationship between the main chuck 15 and the conveying mechanism 21.

As shown in FIG. 1, the conveying mechanism 21 includes a pair of left and right guide rails 21A and 21A, a pair of left and right arms 21B and 21B reciprocating between the outside and inside of the prober chamber 12 along the guide rails 21A and 21A, and a hinge (not shown) for fixing the conveying mechanism 21 such as to be standable, to the front surface of the prober chamber 12. The operator operates the left and right arms 21B and 21B manually, so as to convey the cleaner tool 20 above the main chuck in the prober chamber 12. The conveying mechanism 21, when it is not used, is turned aside downwards on the outer side of the front of the prober chamber 12, to be housed in a cover (not shown). Further, each of the arms 21B and 21B may be automatically driven by an electric motor for reciprocation.

Figure 3A:
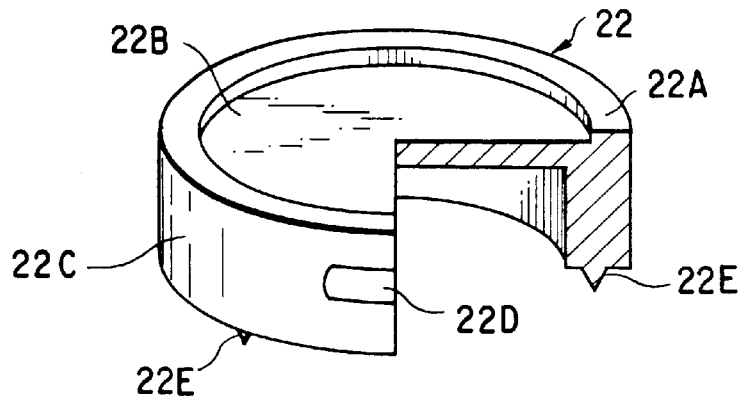
FIG. 3A is a diagram showing a perspective view of the spacer of the embodiment, with parts broken away and in section.
Figure 3B:
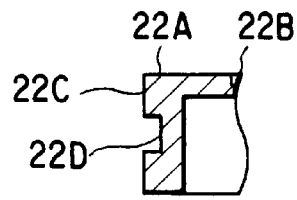
FIG. 3B is an enlarged view of an upper portion of the spacer.

In the steps where the cleaner tool 20 is conveyed to (or from) the main chuck, and where the terminal of the probe is cleaned above the main chuck, the cleaner tool 20 is held by a holder tool. As an example of such a holder, a spacer 22 is illustrated in FIGS. 3A and 3B. The spacer 22 is made of a metal such as stainless aluminum. The spacer 22 has a cylindrical shape having an upper end closed, and a lower end opened, and a recess 22B is formed in the upper surface of an upper wall 22A. The cleaner tool 20, which is shaped into a round disk having substantially the same size as the wafer W, is held in the recess 22B.

In the spacer shown in FIGS. 3A and 3B, the cleaner tool 20 is held as it is engaged with the recess 22B made in the surface of the upper section.

A pair of left and right grooves 22D and 22D (see FIGS. 3A and 3B) are made in the circumferential surface of the lateral wall 22C of the spacer 22, in the lateral direction. The arms 21B and 21B of the conveying mechanism 21 are engaged respectively with the grooves 22D and 22D, so as to support the spacer 22.

Figure 4:
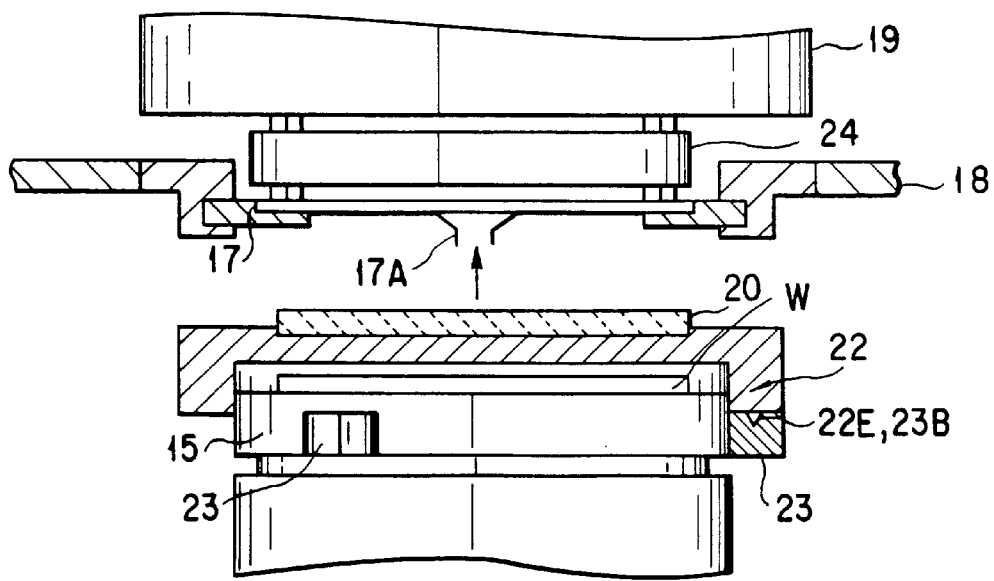
FIG. 4 is a diagram showing a lateral view of the embodiment, illustrating the relationship among the main chuck, spacer, grinding plate and probe.

As shown in FIG. 4, in this embodiment, the spacer 22 is made such that the inner diameter thereof is made slightly larger than the outer diameter of the main chuck 15. When the spacer 22 is mounted on the main chuck 15, the main chuck 15 is fitted to the spacer 22. On the lower surface of the peripheral wall 22C of the spacer 22, a plurality of trigonal pyramid-shaped projections 22E are formed in the circumferential direction. The spacer 22 is supported by supporters 23, and placed on the main chuck 15. While the spacer 22 being placed as described above, a gap is created between the lower surface of the upper wall 22A of the spacer 22 and the upper surface of the main chuck 15, and a wafer W is housed in the gap. On the outer side surface of the main chuck 15, a plurality of supporting portions 23 are formed. In a supporting surface 23A of each of the supporting portions 23, recess sections 23B in which the triangular pyramid-shaped projections 23B of the spacer 22 are fit, are made. The spacer 22 is aligned as the projections 22E fit in the recesses 23B.

The number, arrangement, shapes and the like, of projections 22E formed on the spacer 22, supporting portions 23 and recess portions 23B of the main chuck 15, can be arbitrarily determined. The structures shown in FIGS. 1 to 4 are just preferable examples.

As in the case of the conventional technique, the main chuck 15 is formed to be movable in the X and Y directions by X and Y tables (not shown), as well as in the Z and 0 directions by an ascending mechanism and a 0 drive mechanism (both of which not shown). In FIG. 4, the member designated by reference numeral 24 is a connection ring which electrically connect a test head 19 and a probe card 17 to each other.

The cleaning method for the probe terminal, according to the present invention will now be described in connection with the case where the above-described prober is used. For example, in the middle of testing of a wafer W, when a residue is stuck on the probe (for example, probe needle) 17A, and the conducting property between the probe 17A and an electrode pad is lowered, the test is immediately stopped. Then, the probe 17A is cleaned in the following manner. That is, as shown in FIG. 1, the arms 21B of the conveying mechanism 21 are fit into the grooves 22D of the spacer 22 on which the cleaner tool 200 is mounted. Thus, the arms 21B are pushed into the prober chamber 12. During the period of this operation, the main chuck 15 on which the wafer W is placed is moved to a position directly underneath the spacer 22 5 under the control of the controller 13, and then rotated in the 0 direction so that it face a predetermined direction. Thus, the shaft center of the main chuck 15 coincides with that of the spacer 22, and thus they are set in the state shown in FIG. 2. As can be seen in FIG. 2, the main chuck 15 is moved up in the direction indicated by arrow, and thus the supporting portions 23 of the main chuck 15 support the spacer 22. In this operation, as the projections 22E of the spacer 22 fit the respective recesses 23B of the supporting portions 23 of the main chuck 15, the spacer 22 can be supported by the main chuck 15 without being displaced. The wafer W on the main chuck 15 is housed in the spacer 22 without being in contact with the spacer 22 (see FIG. 4).

As shown in FIG. 4, under the control of the controller 13, the main chuck 15 is moved to a position directly underneath the probe card 17 provided in the prober camber 12. At this position, the main chuck 15 is moved in the Z direction, and thus the probe 17A is brought into contact with the cleaner tool 20. The main chuck 15 is stopped when it is slightly overdriven, and thus the cleaner tool 20 and the probe 17A are pressed against to each other.

The cleaning mode in which the probe 17 is cleaned with the cleaner tool 20 varies depending upon the structure of the cleaner tool 20. Several versions of the cleaning mode are actually employable, for example, the cleaner tool 20 is vibrated to left and right, or it is moved in a circular motion or an arc motion, or it is moved up and down, or in combination of these motions. In the case where the cleaner tool 20 is a grinding cleaner such as grinding stone, the main chuck 15 is repeatedly moved up and down under the control of the controller 13. While reciprocating between the states where the cleaner tool 20 and probe 17A are pressed against each other, and where they are just lightly contact with each other, the probe 17A is cleaned as it is ground by the cleaner tool 20. After the cleaning is finished, the main chuck 15 is moved in the reverse operation to the above, and the cleaner tool 20 is sent together with the spacer 22 to the conveying mechanism 21. Then, the spacer 22 is conveyed to a predetermined position via the conveying mechanism 21, and the test of the wafer W is continued under the control of the controller 13.

As described above, according to this embodiment of the present invention, the probe 17A can be cleaned while the wafer W is being held by the main chuck 15 during the test of the wafer W. Thus, the cleaning time for the probe 17A can be significantly shortened.

Further, the probe can be cleaned while the testing center of the probe card 17 coinciding with the axial center of the main chuck 15. Therefore, even if a wafer W of a larger diameter is used, and accordingly the diameter of the main chuck 15 is increased, an unbalanced load is not applied on the main chuck 15 during the cleaning. Therefore, it is not necessary to reinforce the mechanical strength of the main chuck 15 in consideration of such an unbalanced load.

Figure 5:
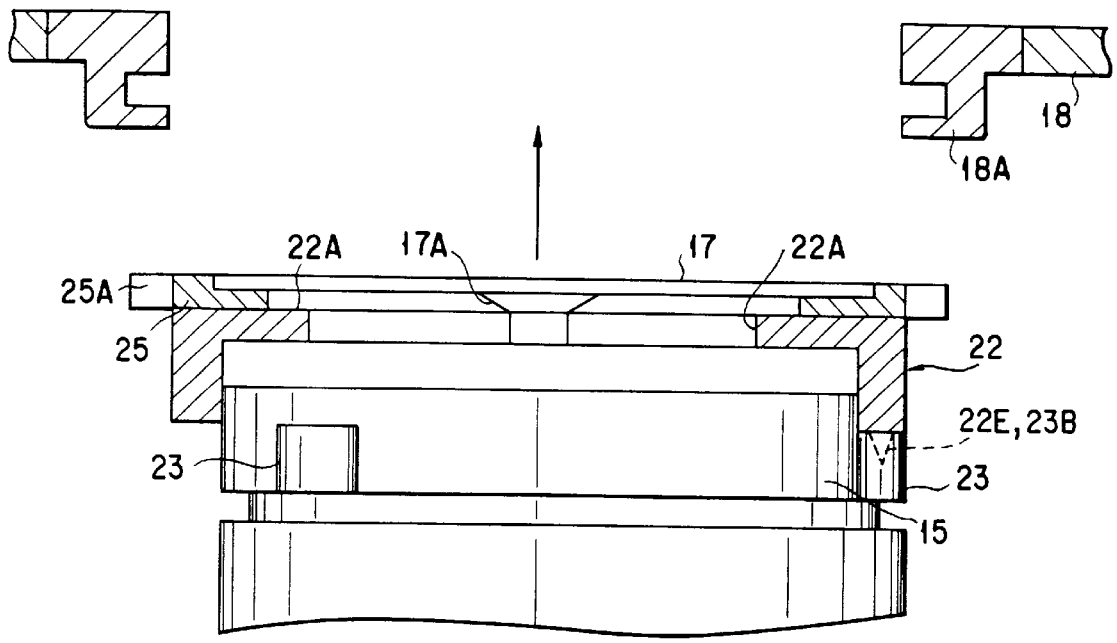
FIG. 5 is a diagram showing a lateral view of another embodiment of the present invention, in the state where the probe card is replaced by means of the main chuck and spacer.
Figure 6:
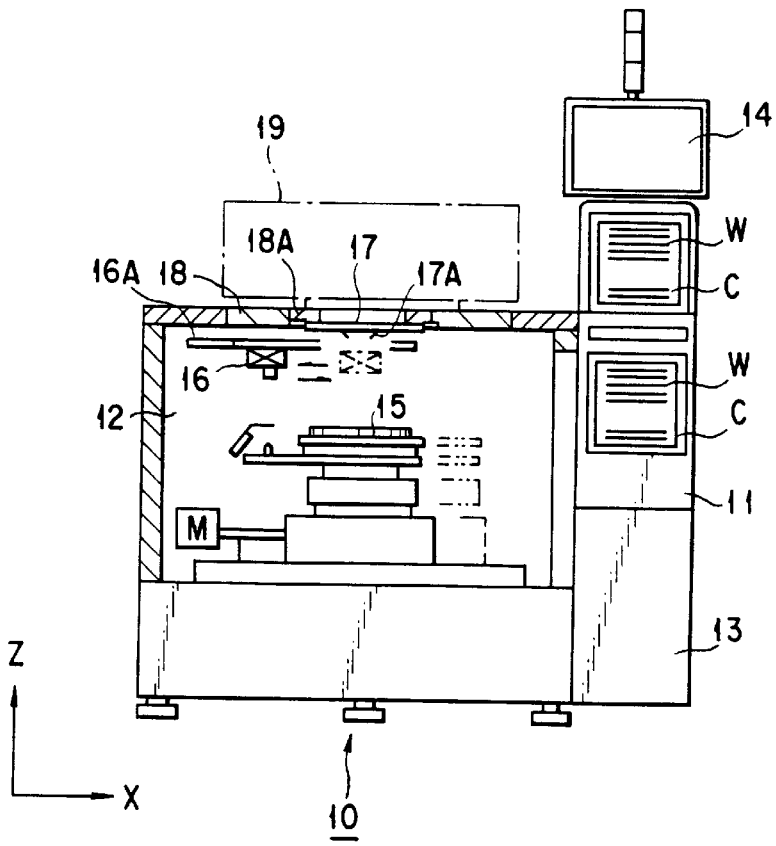
FIG. 6 is a diagram showing a front view of a conventional prober device, with the front surface of the prober chamber broken away and in section.
Figure 7:
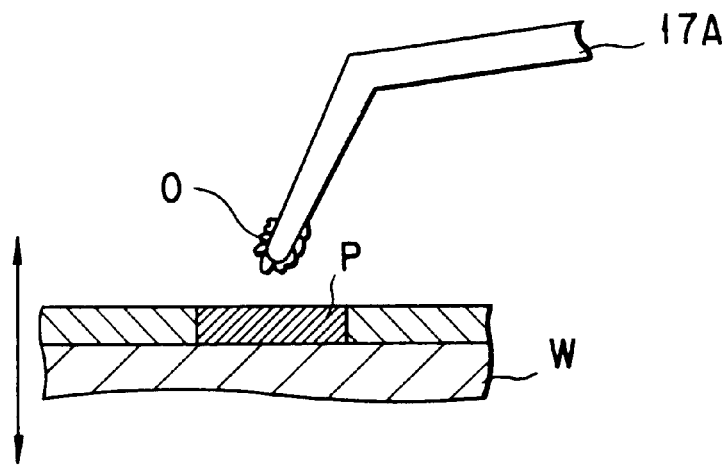
FIG. 7 is a diagram showing a lateral enlarged view of the state where aluminum oxide or the like is adhered to the terminal of a probe.
Figure 8:
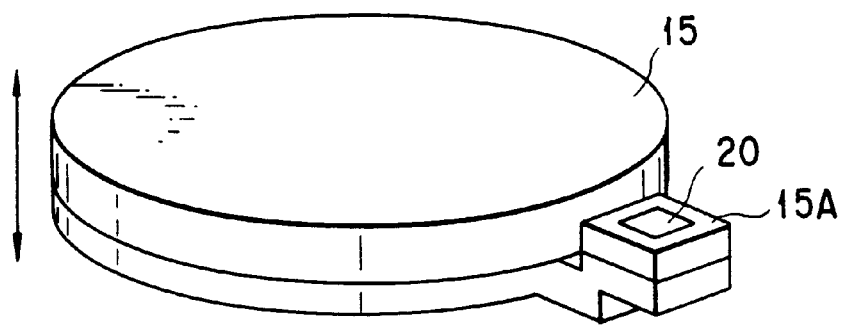
FIG. 8 is a diagram showing an enlarged perspective view of the main chuck of the conventional prober device.

Next, another embodiment of the present invention will now be described with reference to FIG. 5.

In an prober of this embodiment, a main chuck 15, a supporter tool 22 (e.g. spacer) and a conveying mechanism 21 are utilized as a mechanism for replacing a probe card 15. The prober of this embodiment has basically the same structure as that of the abovedescribed embodiment except that a spacer 22 having a different structure is used in this embodiment. The spacer 22 used in this embodiment has the following structure. That is, a central hole 22F is made in an upper wall 22A of the spacer 22 as can be seen in FIG. 5, and with this hole, the probe 17A of a probe card 17 placed on the upper wall 22A for replacement is not damaged. The spacer 22 of this embodiment may have grooves 22D and projections 22E as in the case of the before-described embodiment.

As conventionally known, the card holder 25 is mounted to the probe card 17. The probe card 17 on which the card holder 25 is mounted, is placed on the insert ring 18A fixed to a head plate 18 of the prober room 12. For replacing the probe card 17, the probe card 17 on which the card holder 25 is replaced. A plurality of held sections 25A are formed on the outer periphery of the card holder 25 in the circumferential direction, and a plurality of cutouts (not shown) corresponding respectively to these held sections 25A are made in the insert ring 18A in the circumferential direction.

The probe card 17 on which the card holder 25 is mounted is moved upwards from a position directly below the insert ring 18A under the control of the controller 13, and then the probe card 17 is mounted on the insert ring 18A due to the engagement between the held sections 25A of the card holder 25 and the respective cutouts of the insert ring 18A. As the insert ring 18A, a conventionally well-known type may be employed, and therefore the explanation of the specific structure thereof will be omitted.

A method of replacing the probe card 17 will now be described. The spacer 22 is mounted on the conveying mechanism 21. Then, the conveying mechanism 21 and the main chuck 15 are operated such that the main chuck 15 receives the spacer 22 of the conveying mechanism 21, and the main chuck 15 is moved to a position directly below the insert ring 18A. After that, the main chuck 15 is moved upwards, and thus the card holder 25 holding the probe card 17 and automatically removed from the insert ring 18A is held on the spacer 22. The main chuck 15 is moved in a reverse direction to the above case, and thus the card holder 25 holding the probe card 17 is passed together with the spacer 22, to the conveying mechanism 21. The probe card 17 and the like are moved by the conveying mechanism 21 from the prober chamber 12 to the outside. Then, a spacer 22 which holds the card holder 25 on which a new probe card 17 is held, is set on the conveying mechanism 21.

Further, the conveying mechanism 21 and the main chuck 15 are operated such that the main chuck 15 receives the card holder 25 on which the new probe card 17 is held, from the conveying mechanism 21 together with the spacer 22. The main chuck 15 is moved to a position directly underneath the insert ring 18A. Then, the main chuck 15 is moved upwards, and the card holder 25 holding the probe card 17 is mounted on the insert ring 18A. Thus, the replacement of the probe card 17 is finished. After that, the main chuck 15 is moved and the spacer 22 is passed on to the conveying mechanism 21 from the main chuck 15. Then, the spacer 22 is withdrawn from the prober chamber 12 to the outside by the conveying mechanism 21. After the spacer 22 is removed from the conveying mechanism 21, the conveying mechanism 21 is folded by means of a hinge.

As described above, according to this embodiment, the holding tool (for example, spacer), the main chuck 15 and the conveying mechanism 21 can be utilized as the replacing mechanism for the probe card 17.

According to the present invention, even if the diameter of an object to be tested, such as a wafer, is increased, it is possible to clean the probe terminal without applying an unbalanced load on the main chuck. Further, the probe can be cleaned even in the middle of testing while the object being placed on the main chuck, and therefore the cleaning time can be shortened.

Furthermore, according to the present invention, the main chuck can be used as an automatic replacing mechanism for probe card.

The above description is directed to an embodiment of the present invention; however the present invention can be practiced in some other versions of embodiment, which can be easily recognized by a person skilled in the field of the invention.

For example, for the probe, any type of probe which can be brought into electrical contact with an electrode of an object so as to electrically connect the electrode and the measuring unit, can be employed. Examples of such a probe are needle-like type, bump-like type and pogo pin.

The cleaning tool can be of any type which can remove a matter attached to the probe. Preferable examples of the cleaning tool are tools for sanding a probe (for example, grinding stone, cloth-like tool and a type made of elastic member) and tools for polishing a probe (for example, a brush-like type).

The way the cleaner tool is held by the holding tool or spacer is not limited to the case of the above-described embodiment, but the cleaner tool can be amounted to a predetermined section of the holding tool or spacer in any manner. Preferable versions of holding the cleaner tool are that the cleaner tool is fit in the recess section in the upper surface of the holding tool or spacer, that it is placed on the flat section of the upper surface of either one of these, that it is adhered to the flat section of the upper surface of either one of these, and that it is fixed to the recess section or flat section of the upper surface by means of a holding member such as screw, bar or frame.

The spacer or holding tool, in terms of its outer shape, may be designed to have a variety of shapes, such as cylindrical or prism-like types. Further, the size of the spacer or holding tool can be appropriately determined in accordance with the mechanism of mounting it to the main chuck. Preferably, the spacer or holding tool should be designed to have substantially the same shape and size as those of the main chuck; however these tools may have different shape and size from those of the main chuck.

The contactor may be of a type which brings IC chips formed on a wafer, in contact with probes one by one, or a type which brings IC chips in contact in a plural number at once, or a type which brings all IC chips in contact with probes in batch.

The mechanism of mounting the spacer or holding tool detachably on the main chuck may be of any type as long as the object of the mechanism can be achieved. Preferable examples of such a mechanism are that the spacer or holding tool is mounted detachably to the support section provided on the outer side surface of the main chuck, that it is mounted detachably to the peripheral portion of the upper surface of the main chuck, and that it is mounted detachably to the support section provided close to the main chuck.

Figure 9A:
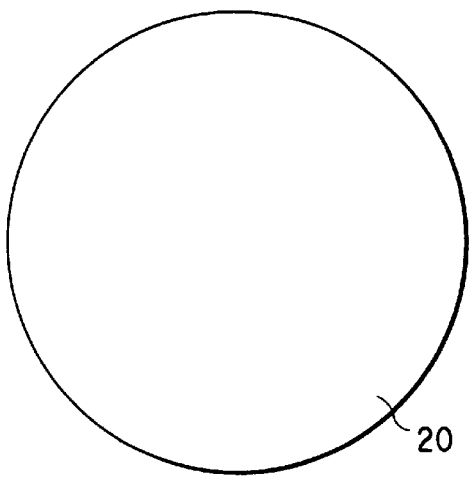
FIGS. 9A to 9F are diagrams illustrating examples of that a grinding cleaner and a polishing cleaner are arranged on a cleaner surface of a cleaner tool, in the embodiments of the present invention.
Figure 9B:
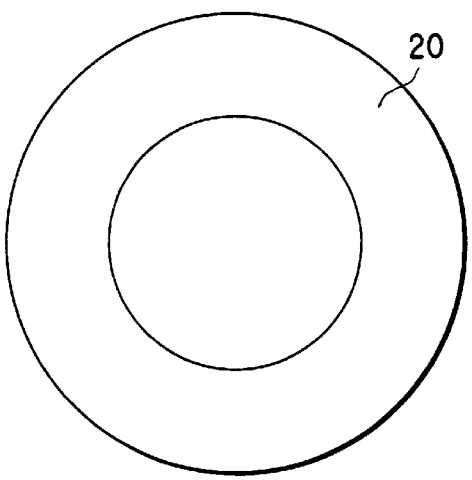
Figure 9C:
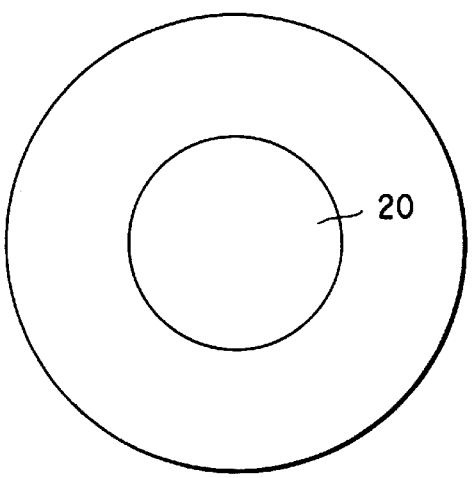
Figure 9D:
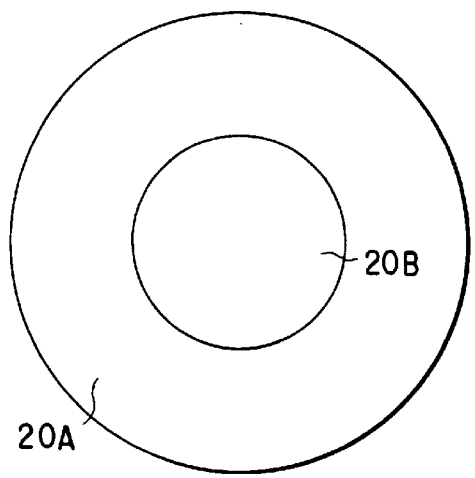
Figure 9E:
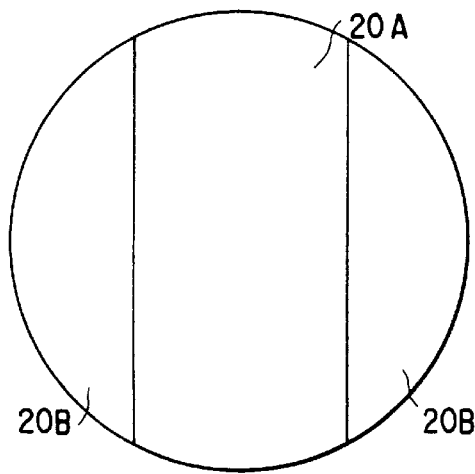
Figure 9F:
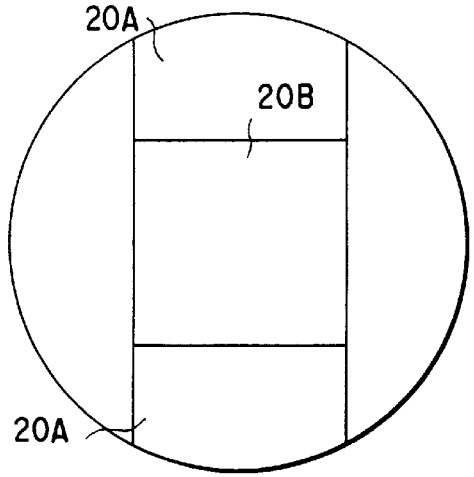

The manner of providing a cleaner on the cleaning surface of the cleaning tool can be appropriately set in accordance with the structures of the probe card, probes, cleaning tool and holding tool. Preferable examples are the cases where the cleaner 20 is provided on the entire cleaning surface (FIG. 9A), where the cleaner 20 is provided for a section of the cleaning surface (FIG. 9B), where the cleaner 20 is provided for the central portion of the entire cleaning surface (FIG. 9C), where the polish cleaner 20B is provided for the central portion of the cleaning surface and the grinding cleaner 20A is provided for the peripheral portion (FIG. 9D), where a cleaner band 20 which crosses the cleaning surface in band-like manner is provided (FIG. 9E), and where the polish cleaner 20B is provided for the central portion of the cleaner band 20 formed to have a shape to cross the cleaning surface, and the grinding cleaner 20A is provided on the peripheral portion. In other versions than those illustrated in FIGS. 9A to 9F, the shape of the cleaning surface may be not only circular or band-like, but also non-circular.

The above-described embodiment was described in connection with the case where the supporting portion 23 for supporting the spacer 22 is provided at a plurality of sections of the main chuck 15. As some other versions, the structure, number and arrangement of the supporting portion 23 may be appropriately determined in accordance with the structures of the main chuck and the spacer 22, so that the spacer 22 can be appropriately supported.

Further, in order to avoid the displacement between the main chuck 15 and the spacer 22, the embodiment employs the version in which the projections are provided for the spacer 22 and the recess sections 23 are provided for the supporting portions 23. As other versions, it is possible that the projections and recess sections are provided vice versa, or the shapes of the projections and recess portions are appropriately determined.

Furthermore, a mechanism including the arm 21B and guide rail 21C was described in the embodiment as the conveying mechanism 21. As other versions, it is possible to employ a mechanism which uses an arm moving in an arc, such as crane.

In the procedure of the above embodiment, the main chuck 15 is moved to a position directly underneath the insert ring 18 after receiving the spacer 22 from the conveying mechanism 21. As another version, it is also possible that the main chuck 15 receives the spacer 22 from the conveying mechanism 21 at a position directly underneath the insert ring 18A.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A prober comprising:

a probe card provided on an upper surface of a main body of said prober;

a main chuck provided in the main body of said prober, underneath said probe card, to be movable in X, Y, Z and $\theta$ directions;

a spacer having an upper portion on which a cleaner tool for the probe card is held;

a conveying mechanism for conveying said spacer between outside of the main body of the prober and a position on said main chuck; and a supporting portion, provided on an outer side surface of said main chuck, for supporting said spacer, wherein said main chuck is moved up and down directly underneath said probe card such that probes of said probe card is cleaned with the cleaner tool on said spacer held on said main chuck.

* * * * *